(12) United States Patent
Yoon et al.

(10) Patent No.: US 12,284,794 B2
(45) Date of Patent: Apr. 22, 2025

(54) ELECTRONIC DEVICE INCLUDING THERMAL DIFFUSION MEMBER

(71) Applicant: Samsung Electronics Co., Ltd., Suwon-si (KR)

(72) Inventors: Jonggeun Yoon, Suwon-si (KR); Sangwon Kim, Suwon-si (KR); Youngwook Kim, Suwon-si (KR); Chankyu Lim, Suwon-si (KR); Pilwon Seo, Suwon-si (KR); Jiwoo Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 98 days.

(21) Appl. No.: 18/359,208

(22) Filed: Jul. 26, 2023

(65) Prior Publication Data

US 2024/0023297 A1     Jan. 18, 2024

Related U.S. Application Data

(63) Continuation of application No. PCT/KR2022/001650, filed on Jan. 28, 2022.

(30) Foreign Application Priority Data

Feb. 2, 2021     (KR) .................. 10-2021-0014612

(51) Int. Cl.
    *H05K 7/20*      (2006.01)
    *G06F 3/0354*    (2013.01)
    *G06F 3/038*     (2013.01)
    *G09G 3/20*      (2006.01)

(52) U.S. Cl.
    CPC ..... *H05K 7/20963* (2013.01); *G06F 3/03545* (2013.01); *G06F 3/038* (2013.01);
    (Continued)

(58) Field of Classification Search
    CPC .. H05K 1/02; H05K 1/14; H05K 5/00; H05K 7/20; H05K 7/20963; H05K 9/00;
    (Continued)

(56) References Cited

U.S. PATENT DOCUMENTS 10,371,584 B2    8/2019  Kim et al.
10,917,708 B2    2/2021  Won et al.
(Continued)

FOREIGN PATENT DOCUMENTS

KR    10-2014-0079125 A    6/2014
KR    10-2015-0092812 A    8/2015
(Continued)

OTHER PUBLICATIONS

International Search Report dated May 10, 2022, issued in an International Application No. PCT/KR2022/001650.

*Primary Examiner* — Chanh D Nguyen
*Assistant Examiner* — Nguyen H Truong
(74) *Attorney, Agent, or Firm* — Jefferson IP Law, LLP

(57) ABSTRACT

An electronic device including a thermal diffusion member for reducing hot spots is provided. The electronic device includes a plurality of display driver integrated circuits (DDICs) spaced apart from each other in a non-display area of a display panel, and disposed oriented in a first direction from the display panel, a circuit board disposed in a second direction opposite to the first direction from the display panel, and including a timing controller IC (T-CON IC) disposed so as to overlap at least some of the plurality of DDICs when the display panel is viewed from the first direction, a flexible circuit board disposed at one end of the display panel, and electrically connecting the plurality of DDICs and the circuit board, and a thermal diffusion member disposed, between the circuit board and the display panel.

15 Claims, 11 Drawing Sheets

(52) U.S. Cl.
CPC ......... *G09G 3/2007* (2013.01); *G09G 3/2096* (2013.01); *G09G 2320/041* (2013.01); *G09G 2320/0626* (2013.01); *G09G 2340/0435* (2013.01); *G09G 2354/00* (2013.01)

(58) Field of Classification Search
CPC ... G06F 1/16; G06F 1/20; G06F 3/038; G06F 3/0354; G06F 3/03545; G06F 3/2007; G06F 3/2096; H01L 21/84; H01L 23/00; H01L 27/12; H01L 27/32; H01L 25/00; H01L 25/10; H01L 25/18; H01L 31/113; H01L 51/00; H01L 51/52; H01L 51/56; G09G 3/00; G09G 3/20; G09G 3/32; G09G 3/3225; G09G 2320/041; G09G 2320/0626; G09G 2340/0435; G09G 2354/00

See application file for complete search history.

(56) References Cited

U.S. PATENT DOCUMENTS

| | | | |
|---|---|---|---|
| 2013/0320851 A1* | 12/2013 | Choi | .......... H10K 59/126 315/85 |
| 2014/0169033 A1 | 6/2014 | Yu et al. | |
| 2014/0355214 A1* | 12/2014 | Tamai | ................ H05K 7/20409 29/890.03 |
| 2015/0219943 A1 | 8/2015 | Noh et al. | |
| 2016/0100508 A1* | 4/2016 | Kim | .................... H05K 7/20963 361/707 |
| 2016/0183415 A1* | 6/2016 | Kim | ..................... H05K 1/0209 345/205 |
| 2017/0006738 A1 | 1/2017 | Lee et al. | |
| 2018/0157094 A1 | 6/2018 | Lee et al. | |
| 2019/0302351 A1* | 10/2019 | Hayashi | ................ G02B 6/002 |
| 2020/0077545 A1 | 3/2020 | Nong | |
| 2020/0245071 A1 | 7/2020 | Won et al. | |
| 2020/0252707 A1 | 8/2020 | Won et al. | |
| 2022/0209168 A1* | 6/2022 | Kong | ................... H10K 50/844 |

FOREIGN PATENT DOCUMENTS

| | | |
|---|---|---|
| KR | 10-2016-0077311 A | 7/2016 |
| KR | 10-1651292 B1 | 8/2016 |
| KR | 10-2017-0004068 A | 1/2017 |
| KR | 10-2019-0051515 A | 5/2019 |
| KR | 10-2078093 B1 | 2/2020 |
| KR | 10-2020-0094867 A | 8/2020 |
| KR | 10-2020-0096368 A | 8/2020 |
| WO | 2018-090725 A1 | 5/2018 |

* cited by examiner

ELECTRONIC DEVICE INCLUDING THERMAL DIFFUSION MEMBER

CROSS-REFERENCE TO RELATED APPLICATION(S)

This application is a continuation application, claiming priority under § 365(c), of an International application No. PCT/KR2022/001650, filed on Jan. 28, 2022, which is based on and claims the benefit of a Korean patent application number filed on Feb. 2, 2021, in the Korean Intellectual Property Office, the disclosure of which is incorporated by reference herein in its entirety.

BACKGROUND

1. Field

The disclosure relates to an electronic device including a thermal diffusion member for reducing hot spots.

2. Description of Related Art

With advances in the performance of electronic parts disposed in electronic devices, the amount of heat that is generated by the electronic parts also gradually increases. For example, a display of an electronic device tends to be developed with a high refresh rate, high luminance, and high resolution. If the refresh rate of the display is increased, moving images can be expressed more naturally.

The above information is presented as background information only to assist with an understanding of the disclosure. No determination has been made, and no assertion is made, as to whether any of the above might be applicable as prior art with regard to the disclosure.

SUMMARY

When a display is driven with a high refresh rate, high luminance, and high resolution, the heat generated by electronic parts that drive the display, a display driver integrated circuit (DDIC) and/or a timing controller IC (T-CON IC), may increase. For example, a hot spot may occur in a portion of an electronic device in which a DDIC and/or a T-CON IC are disposed. Since hot spots can cause electronic devices to malfunction, a technology for efficiently transferring and dissipating the heat generated from electronic parts may be continuously required.

Aspects of the disclosure are to address at least the above-mentioned problems and/or disadvantages and to provide at least the advantages described below. Accordingly, an aspect of the disclosure is to provide an electronic device including a thermal diffusion member for reducing hot spots.

Additional aspects will be set forth in part in the description which follows and, in part, will be apparent from the description, or may be learned by practice of the presented embodiments.

In accordance with an aspect of the disclosure, an electronic device is provided. The electronic device includes a housing, a display panel including a display area that is visually exposed from an outside and a non-display area that is not visually exposed from the outside, a plurality of display driver ICs (DDICs) disposed at intervals in the non-display area, and disposed oriented in a first direction from the display panel, a circuit board disposed in a second direction opposite to the first direction from the display panel, and including a timing controller IC (T-CON IC) which is disposed to overlap at least some of the plurality of DDICs when the display panel is viewed from the first direction, a flexible circuit board disposed at one end of the display panel and electrically connecting the plurality of DDICs and the circuit board, and a thermal diffusion member disposed between the circuit board and the display panel, and disposed in an area in which at least some of the plurality of DDICs and the timing controller IC overlap each other when the display panel is viewed from the first direction.

An electronic device according to various embodiments of the disclosure, hot spots can be reduced by disposing a thermal diffusion member in an area where at least some of a plurality of DDICs and a T-CON IC overlap each other when a display panel is viewed from the front.

An electronic device according to various embodiments of the disclosure may reduce malfunctions and increase part lifespan by reducing hot spots.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
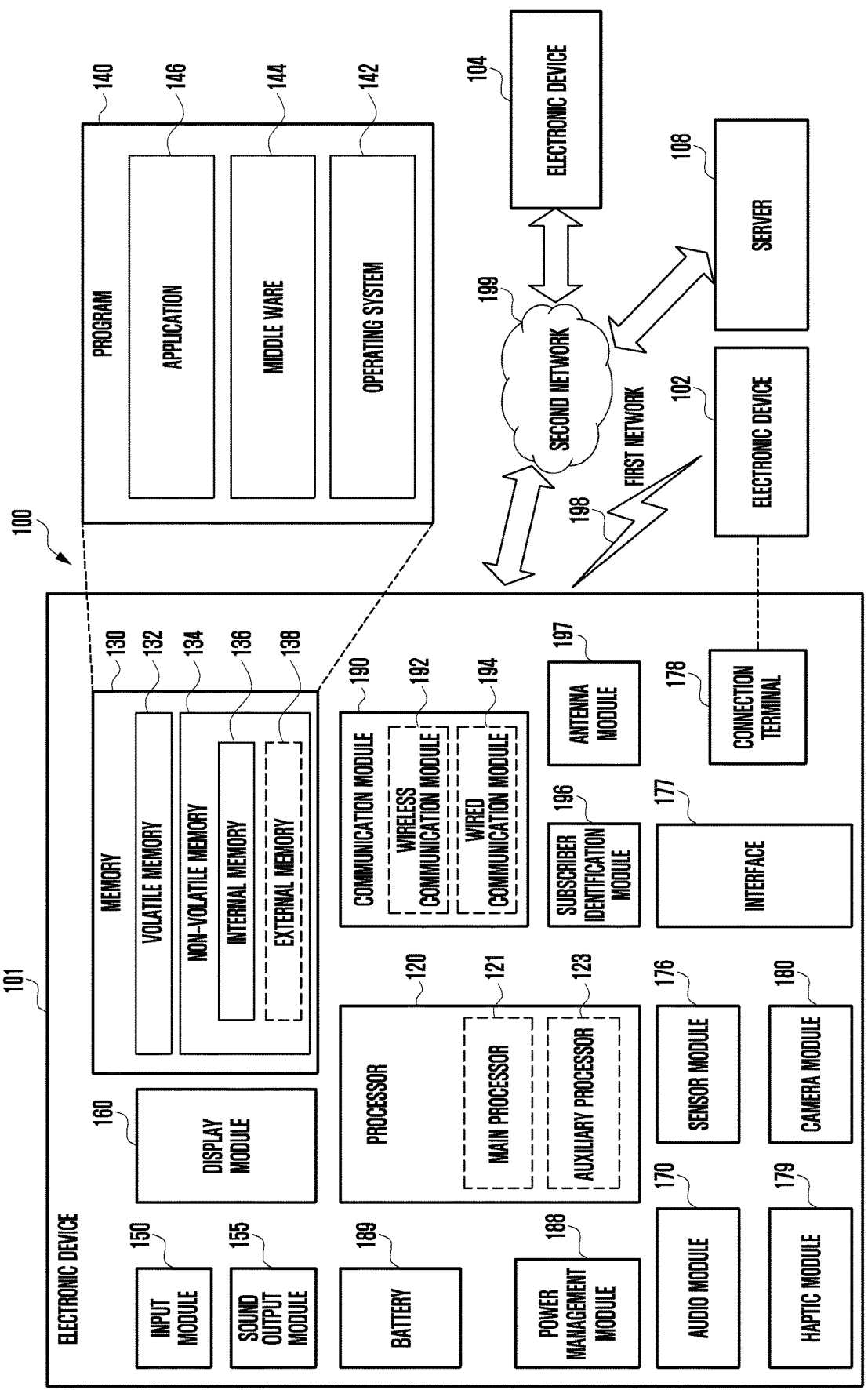
FIG. 1 is a block diagram illustrating an electronic device in a network environment, according to an embodiment of the disclosure.

FIG. 1 is a block diagram illustrating an electronic device in a network environment according to an embodiment of the disclosure.

Referring to FIG. 1, an electronic device 101 in a network environment 100 may communicate with an external electronic device 102 via a first network 198 (e.g., a short-range wireless communication network), or at least one of an external electronic device 104 or a server 108 via a second network 199 (e.g., a long-range wireless communication network). According to an embodiment of the disclosure, the electronic device 101 may communicate with the external electronic device 104 via the server 108. According to an embodiment of the disclosure, the electronic device 101 may include a processor 120, a memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments of the disclosure, at least one of the components (e.g., the connecting terminal 178) may be omitted from the electronic device 101, or one or more other components may be added in the electronic device 101. In some embodiments of the disclosure, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment of the disclosure, as at least part of the data processing or computation, the processor 120 may store a command or data received from another component (e.g., the sensor module 176 or the communication module 190) in a volatile memory 132, process the command or the data stored in the volatile memory 132, and store resulting data in a non-volatile memory 134. According to an embodiment of the disclosure, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., a sleep) state, or together with the main processor 121 while the main processor 121 is in an active state (e.g., executing an application). According to an embodiment of the disclosure, the auxiliary processor 123 (e.g., an image signal processor or a communication processor) may be implemented as part of another component (e.g., the camera module 180 or the communication module 190) functionally related to the auxiliary processor 123. According to an embodiment of the disclosure, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment of the disclosure, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment of the disclosure, the display module 160 may include a touch sensor adapted to detect a touch, or a pressure sensor adapted to measure the intensity of force incurred by the touch.

The audio module 170 may convert a sound into an electrical signal and vice versa. According to an embodiment of the disclosure, the audio module 170 may obtain the sound via the input module 150, or output the sound via the sound output module 155 or a headphone of an external electronic device (e.g., the external electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment of the disclosure, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the external electronic device 102) directly (e.g., wiredly) or wirelessly. According to an embodiment of the disclosure, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the external electronic device 102). According to an embodiment of the disclosure, the connecting terminal 178 may include, for example, a HDMI connector, a USB connector, an SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment of the disclosure, the haptic module 179 may include, for example, a motor, a piezoelectric element, or an electric stimulator.

The camera module 180 may capture a still image or moving images. According to an embodiment of the disclosure, the camera module 180 may include one or more lenses, image sensors, image signal processors, or flashes.

The power management module 188 may manage power supplied to the electronic device 101. According to one embodiment of the disclosure, the power management module 188 may be implemented as at least part of, for example, a power management integrated circuit (PMIC).

The battery 189 may supply power to at least one component of the electronic device 101. According to an embodiment of the disclosure, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the external electronic device 102, the external electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment of the disclosure, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a fifth generation (5G) network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a fourth generation (4G) network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the millimeter wave (mmWave) band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the external electronic device 104), or a network system (e.g., the second network 199). According to an embodiment of the disclosure, the wireless communication module 192 may support a peak data rate (e.g., 20 gigabits per second (Gbps) or more)

for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment of the disclosure, the antenna module 197 may include an antenna including a radiating element including a conductive material or a conductive pattern formed in or on a substrate (e.g., a printed circuit board (PCB)). According to an embodiment of the disclosure, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment of the disclosure, another component (e.g., a radio frequency integrated circuit (RFIC)) other than the radiating element may be additionally formed as part of the antenna module 197.

According to various embodiments of the disclosure, the antenna module 197 may form a mmWave antenna module. According to an embodiment of the disclosure, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment of the disclosure, commands or data may be transmitted or received between the electronic device 101 and the external electronic device 104 via the server 108 coupled with the second network 199. Each of the external electronic devices 102 or 104 may be a device of a same type as, or a different type, from the electronic device 101. According to an embodiment of the disclosure, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment of the disclosure, the external electronic device 104 may include an internet-of-things (IoT) device. The server 108 may be an intelligent server using machine learning and/or a neural network. According to an embodiment of the disclosure, the external electronic device 104 or the server 108 may be included in the second network 199. The electronic device 101 may be applied to intelligent services (e.g., smart home, smart city, smart car, or healthcare) based on 5G communication technology or IoT-related technology.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used in connection with various embodiments of the disclosure, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment of the disclosure, the module may be implemented in a form of an application-specific integrated circuit (ASIC).

Various embodiments as set forth herein may be implemented as software (e.g., the program 140) including one or more instructions that are stored in a storage medium (e.g., an internal memory 136 or an external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment of the disclosure, a method according to various embodiments of the disclosure may be included and provided in a computer program product. The computer program product may be traded as a product between a seller and a buyer. The computer program product may be distributed in the form of a machine-readable storage medium (e.g., a compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments of the disclosure, each component (e.g., a module or a program) of the above-described components may include a single entity or multiple entities, and some of the multiple entities may be separately disposed in different components. According to various embodiments of the disclosure, one or more of the above-described components may be omitted, or one or more other components may be added. Alternatively or additionally, a plurality of components (e.g., modules or programs) may be integrated into a single component. In such a case, according to various embodiments of the disclosure, the integrated component may still perform one or more functions of each of the plurality of components in the same or similar manner as they are performed by a corresponding one of the plurality of components before the integration. According to various embodiments of the disclosure, operations performed by the module, the program, or another component may be carried out sequentially, in parallel, repeatedly, or heuristically, or one or more of the operations may be executed in a different order or omitted, or one or more other operations may be added.

Figure 2:
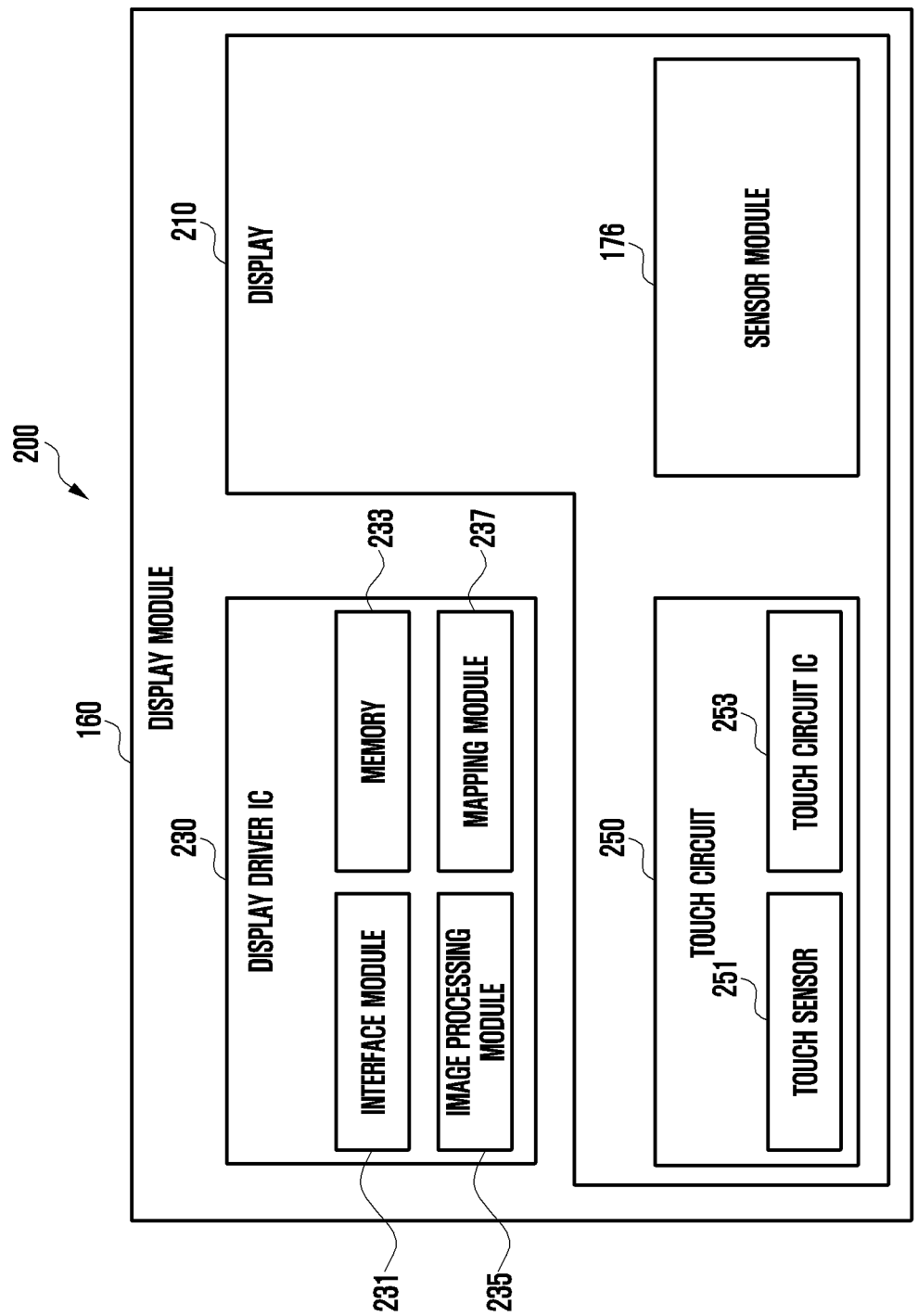
FIG. 2 is a block diagram illustrating a display module according to an embodiment of the disclosure.

FIG. 2 is a block diagram 200 illustrating a display module according to an embodiment of the disclosure.

Referring to FIG. 2, the display module 160 may include a display 210 and a display driver integrated circuit (DDIC) 230 to control the display 210. The DDIC 230 may include an interface module 231, a memory 233 (e.g., buffer memory), an image processing module 235, or a mapping module 237. The DDIC 230 may receive image information that contains image data or an image control signal corresponding to a command to control the image data from another component of the electronic device 101 via the interface module 231. For example, according to an embodiment of the disclosure, the image information may be received from the processor 120 (e.g., the main processor 121 (e.g., an application processor)) or the auxiliary processor 123 (e.g., a graphics processing unit) operated independently from the function of the main processor 121. The DDIC 230 may communicate, for example, with touch circuitry 250 or the sensor module 176 via the interface module 231. The DDIC 230 may also store at least part of the received image information in the memory 233, for example, on a frame by frame basis. The image processing module 235 may perform pre-processing or post-processing (e.g., adjustment of resolution, brightness, or size) with respect to at least part of the image data. According to an embodiment of the disclosure, the pre-processing or post-processing may be performed, for example, based at least in part on one or more characteristics of the image data or one or more characteristics of the display 210. The mapping module 237 may generate a voltage value or a current value corresponding to the image data pre-processed or post-processed by the image processing module 235. According to an embodiment of the disclosure, the generating of the voltage value or current value may be performed, for example, based at least in part on one or more attributes of the pixels (e.g., an array, such as a red green blue (RGB) stripe or a pentile structure, of the pixels, or the size of each subpixel). At least some pixels of the display 210 may be driven, for example, based at least in part on the voltage value or the current value such that visual information (e.g., a text, an image, or an icon) corresponding to the image data may be displayed via the display 210.

According to an embodiment of the disclosure, the display module 160 may further include the touch circuitry 250. The touch circuitry 250 may include a touch sensor 251 and a touch sensor IC 253 to control the touch sensor 251. The touch sensor IC 253 may control the touch sensor 251 to detect a touch input or a hovering input with respect to a certain position on the display 210. To achieve this, for example, the touch sensor 251 may detect (e.g., measure) a change in a signal (e.g., a voltage, a quantity of light, a resistance, or a quantity of one or more electric charges) corresponding to the certain position on the display 210. The touch circuitry 250 may provide input information (e.g., a position, an area, a pressure, or a time) indicative of the touch input or the hovering input detected via the touch sensor 251 to the processor 120. According to an embodiment of the disclosure, at least part (e.g., the touch sensor IC 253) of the touch circuitry 250 may be formed as part of the display 210 or the DDIC 230, or as part of another component (e.g., the auxiliary processor 123) disposed outside the display module 160.

According to an embodiment of the disclosure, the display module 160 may further include at least one sensor (e.g., a fingerprint sensor, an iris sensor, a pressure sensor, or an illuminance sensor) of the sensor module 176 or a control circuit for the at least one sensor. In such a case, the at least one sensor or the control circuit for the at least one sensor may be embedded in one portion of a component (e.g., the display 210, the DDIC 230, or the touch circuitry 250)) of the display module 160. For example, when the sensor module 176 embedded in the display module 160 includes a biometric sensor (e.g., a fingerprint sensor), the biometric sensor may obtain biometric information (e.g., a fingerprint image) corresponding to a touch input received via a portion of the display 210. As another example, when the sensor module 176 embedded in the display module 160 includes a pressure sensor, the pressure sensor may obtain pressure information corresponding to a touch input received via a partial or whole area of the display 210. According to an embodiment of the disclosure, the touch sensor 251 or the sensor module 176 may be disposed between pixels in a pixel layer of the display 210, or over or under the pixel layer.

An electronic device (e.g., an electronic device 300 in FIG. 3) according to various embodiments may comprise a housing, a display panel (e.g., a display panel 510 in FIG. 5) including a display area that is visually exposed from an outside, and a non-display area that is not visually exposed from the outside, a plurality of display driver ICs (DDICs)

(e.g., a DDIC 520 in FIG. 5) disposed at intervals in the non-display area and disposed oriented in a first direction from the display panel 510, a circuit board (e.g., a circuit board 540 in FIG. 6) disposed in a second direction opposite to the first direction from the display panel 510, and including a timing controller IC which is disposed to overlap at least some of the plurality of DDICs 520 when the display panel 510 is viewed from the first direction, a flexible circuit board (e.g., a flexible circuit board 530 in FIG. 5) disposed on one end of the display panel 510 and electrically connecting the plurality of DDICs 520 and the circuit board 540, and a thermal diffusion member (e.g., a thermal diffusion member 560 in FIG. 6) disposed between the circuit board 540 and the display panel 510, and disposed in an area in which at least some of the plurality of DDICs 520 and a T-CON IC 550 overlap each other when the display panel 510 is viewed from the first direction.

According to an embodiment of the disclosure, the thermal diffusion member 560 may be disposed to extend from the non-display area to the display area when the display panel 510 is viewed in the first direction.

According to an embodiment of the disclosure, the stacked structure of the thermal diffusion member 560 may include a thermal diffusion layer attached to the rear surface of the display panel 510 orienting the second direction, and a thermal blocking layer disposed in the second direction from the thermal diffusion layer.

According to an embodiment of the disclosure, the thermal diffusion layer of the thermal diffusion member 560 may include at least one of graphite and thermal interface material (TIM).

According to an embodiment of the disclosure, the thermal blocking layer of the thermal diffusion member 560 may include at least one of copper, a metal member, a metal sheet, and a metal plate.

According to an embodiment of the disclosure, the stacked structure of the thermal diffusion member 560 may further include a non-conductive coating layer disposed to face the circuit board 540.

According to an embodiment of the disclosure, the stacked structure of the thermal diffusion member 560 further includes a conductive coating layer disposed to face the circuit board 540, and at least a portion of the conductive coating layer may be electrically connected to a ground of the circuit board 540.

According to an embodiment of the disclosure, a plurality of double-sided adhesive members disposed between the circuit board 540 and the display panel 510 may be further included, and the plurality of double-sided adhesive members may be disposed at intervals in an area where at least some of the plurality of DDICs 520 and the T-CON IC 550 do not overlap each other when the display panel 510 is viewed in the first direction.

According to an embodiment of the disclosure, the thermal diffusion member 560 may include a first portion disposed to overlap the circuit board 540 and a second portion disposed to extend from one end of the first portion and overlap a portion of the display area, and an area of the second portion may be larger than an area of the first portion.

According to an embodiment of the disclosure, the thermal conductivity of the thermal diffusion layer may be higher than that of the thermal blocking layer.

According to an embodiment of the disclosure, a plurality of double-sided adhesive members disposed between the circuit board 540 and the display panel 510 may be further included, and the plurality of double-sided adhesive members may include at least one first double-sided adhesive member disposed not to overlap the thermal diffusion member 560, and at least one second double-sided adhesive member disposed to overlap the thermal diffusion member 560. The first double-sided adhesive member may be formed to be thicker than the second double-sided adhesive member.

According to an embodiment of the disclosure, a processor that controls the plurality of DDICs 520 and the T-CON IC 550 may be further included. The processor executes an application based on a user input, and determines whether the executed application is a predetermined application, and displays an execution screen of the application while configuring a background screen to a value lower than a predetermined grayscale value if the executed application is the predetermined application.

According to an embodiment of the disclosure, the predetermined application may include at least one application configured to detect a user input through an electronic pen.

According to an embodiment of the disclosure, the processor may detect the temperature of the display panel 510 through the sensor module of the electronic device 300, and may lower the overall luminance of the display panel 510 if the temperature of at least a portion of the display panel 510 is greater than a predetermined temperature.

According to an embodiment of the disclosure, the processor may detect the temperature of the housing through the sensor module of the electronic device 300, and may lower the overall luminance of the display panel 510 if the temperature of at least a portion of the housing is greater than a predetermined temperature.

According to an embodiment of the disclosure, the processor may detect the temperature of at least some electronic parts disposed in the inner space of the housing, and may lower the overall luminance of the display panel 510 if the temperature of the electronic part is greater than a predetermined temperature.

According to an embodiment of the disclosure, an electronic pen may be further included, and the processor may display an execution screen of the application at a first refresh rate, detects whether the electronic pen approaches the surface of the display panel 510 within a predetermined distance, and may display the execution screen of the application at a second refresh rate if the electronic pen approaches the surface of the display panel 510 within a predetermined distance. The second refresh rate may be higher than the first refresh rate.

According to an embodiment of the disclosure, the second refresh rate may have a value corresponding to a multiple of the first refresh rate.

Figure 3:
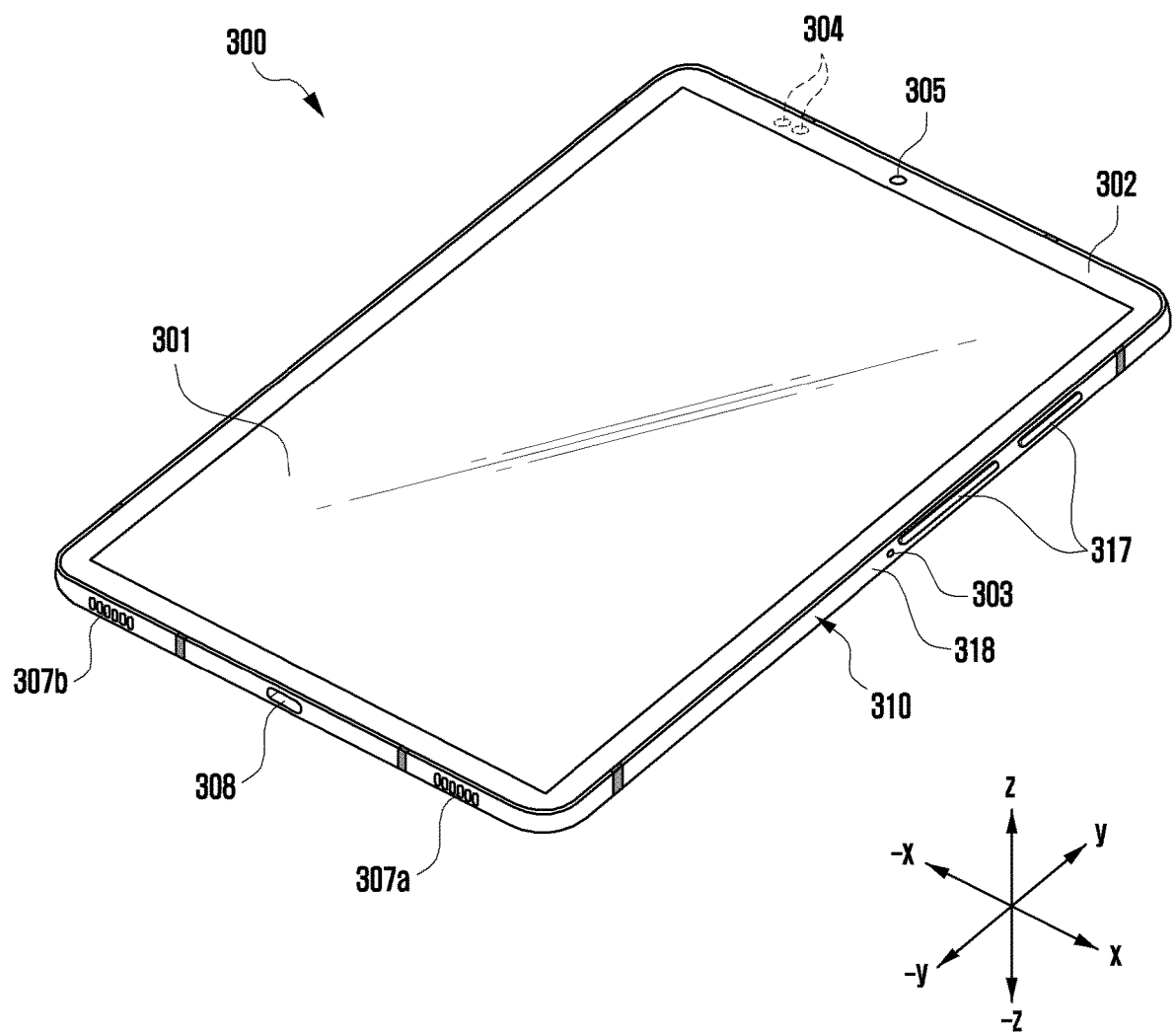
FIG. 3 is a perspective view illustrating a front surface of an electronic device according to an embodiment of the disclosure.
Figure 4:
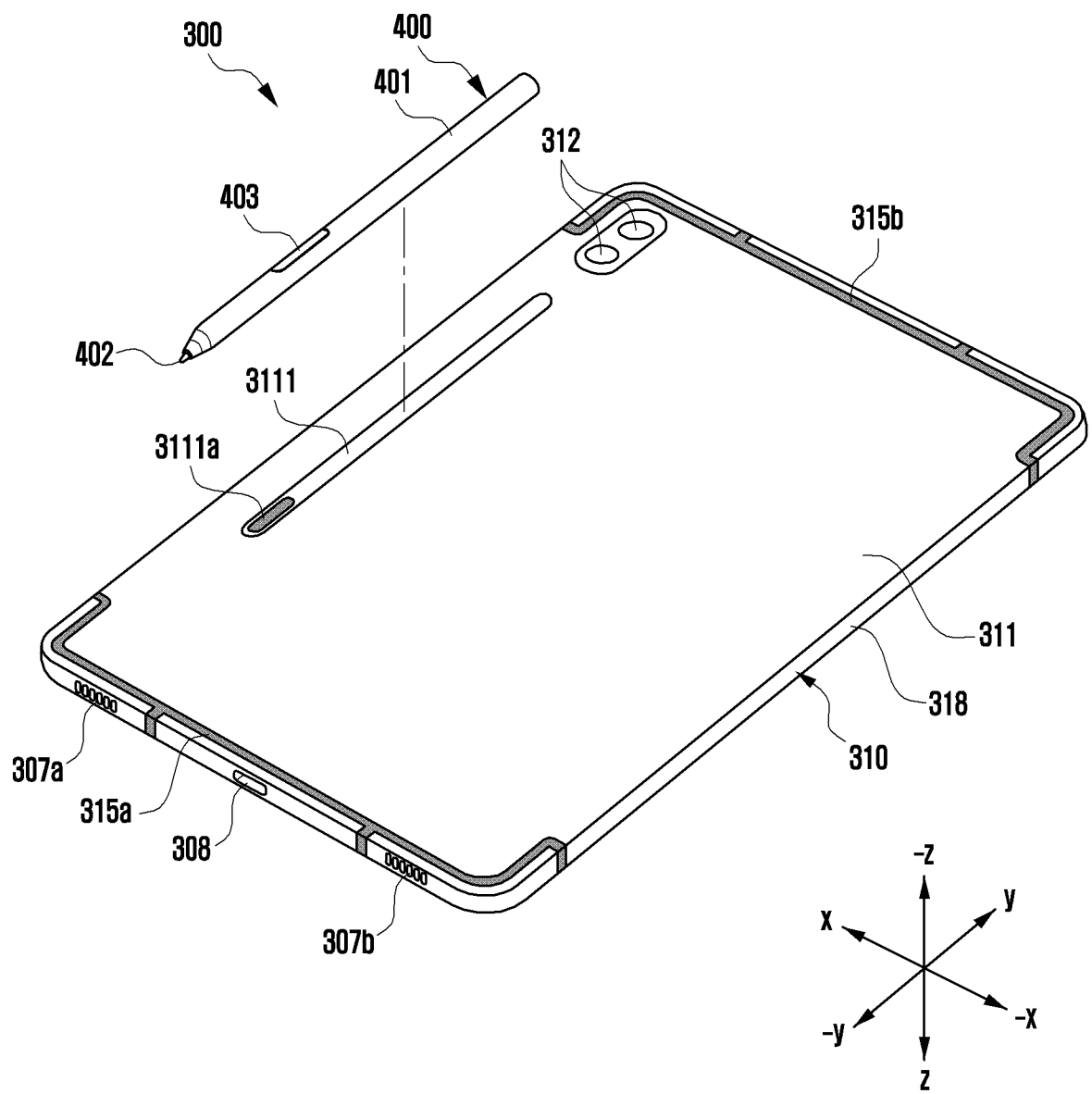
FIG. 4 is a perspective view illustrating a rear surface of an electronic device of FIG. 3 according to an embodiment of the disclosure.

FIG. 3 is a perspective view illustrating a front surface of an electronic device according to an embodiment of the disclosure. FIG. 4 is a perspective view illustrating a rear surface of an electronic device of FIG. 3 according to an embodiment of the disclosure.

Referring to FIGS. 3 and 4, the electronic device 300 according to one embodiment may include a housing 310 that includes a front cover 302 (e.g., a front plate or a front window) oriented in a first direction (z direction), a rear cover 311 (e, g, rear plate or rear window) oriented in a second direction (−z direction) opposite to the first direction, and a lateral member 318 surrounding an inner space (not illustrated) between the front cover 302 and the rear cover 311. In one embodiment of the disclosure, the front cover 302 may be formed of a glass plate or polymer plate having various coating layers. In one embodiment of the disclosure, the rear cover 311 may be formed, for example, of coated or colored glass, ceramic, polymer, metal (e.g., aluminum, stainless steel (STS), or magnesium), or a combination of at least two of the foregoing. In one embodiment of the disclosure, the lateral member 318 may be formed of a lateral bezel structure combined with the front cover 302 and/or the rear cover 311 and having a metal and/or polymer. In another embodiment of the disclosure, the rear cover 311 and/or the lateral member 318 may be integrally formed and have the same material (e.g., metal, such as aluminum or magnesium).

According to various embodiments of the disclosure, the electronic device 300 may include a display panel 301, at least one input device 303, sound output devices 307a and 307b, a sensor module 304, camera modules 305, 312, a key input device 317, and/or a connector port 308. In another embodiment of the disclosure, the electronic device 300 may omit at least one of the above-listed components (e.g., the key input device 317) or further include any other component. In one embodiment of the disclosure, the display panel 301 may be exposed, for example, through a considerable portion of the front cover 302. In another embodiment of the disclosure, the display panel 301 may be exposed through the substantially entire area of front cover 302. In another embodiment of the disclosure, in order to expand an exposed area of the display panel 301, a gap between outside of the display panel 301 and outside of the front cover 302 may be formed substantially the same. In another embodiment of the disclosure, the display panel 301 may have a recess or opening in a portion of a screen display area such that at least one of the above-listed components is disposed within the recess or opening in the inner space of the electronic device 300. In another embodiment of the disclosure, at least one of the sensor module 304, the camera module 305, a fingerprint sensor (not illustrated), or a light emitting device (not illustrated) may be disposed under the display area (e.g., active area) of the display panel 301 and/or under the front cover 302 in the inner space of the electronic device 300. In another embodiment of the disclosure, the display panel 301 may be disposed to be combined with or adjacent to a touch detection circuit, a pressure sensor for measuring the intensity (or pressure) of a touch, and/or an electromagnetic induction panel (e.g., a digitizer) for detecting an electronic pen 400 (e.g., a stylus pen) of magnetic field type.

According to various embodiment of the disclosure, the input device 303 may include at least one microphone module 303. In some embodiments of the disclosure, the input device 303 may include a plurality of microphone modules 303 disposed at different positions to detect the direction of sound. The sound output devices 307a and 307b may include a speaker module. The speaker modules 307a and 307b may include an external speaker and/or a call receiver.

According to various embodiments of the disclosure, the at least one sensor module 304 may generate an electrical signal or data value corresponding to an internal operating state or external environmental state of the electronic device 300. The at least one sensor module 304 may further include, for example, at least one of a proximity sensor, a gesture sensor, a gyro sensor, a barometric sensor, a magnetic sensor, an acceleration sensor, a grip sensor, a color sensor, an infrared (IR) sensor, a biometric sensor, a temperature sensor, a humidity sensor, and an illuminance sensor.

According to various embodiments of the disclosure, the key input device 317 may be disposed to be partially exposed through the lateral member 318 of the housing 310. In another embodiment of the disclosure, the electronic device 300 may not include some or all of the above described key input devices 317, and the key input device 317 that is not included may be implemented in the form of a soft key on the display panel 301. In another embodiment of the disclosure, the key input device 317 may be implemented using a pressure sensor included in the display panel 301. In another embodiment of the disclosure, the key input device 317 may include at least one pressure-sensitive key using a strain gauge disposed in the electronic device 300 and measuring a pressure change due to a pressure of the lateral member 318. According to an embodiment of the disclosure, the connector port 308 may accommodate a connector port (e.g., receptacle (e.g., a USB connector port or an IF connector port) for transmitting and receiving power, data, and/or sound signals to and from an external electronic device.

According to various embodiments of the disclosure, the camera modules 305 and 312 may include a front camera module 305 disposed to be exposed to the outside through the front cover 302 of the electronic device 300, and/or a rear camera module 312 disposed to be exposed to the outside through the rear cover 311. According to an embodiment of the disclosure, the camera modules 305 and 312 may include one or a plurality of lenses, an image sensor, and/or an image signal processor. According to an embodiment of the disclosure, the rear camera module 312 may include a plurality of camera modules, and may perform a multi-camera function for general shooting, wide-angle shooting, close-up shooting, telephoto shooting and/or ultra-wide-angle shooting. In another embodiment of the disclosure, the rear camera module 312 may further include or be substituted for a time of flight (TOF) camera and/or a light detection and ranging (LiDAR) scanner.

According to various embodiments of the disclosure, the electronic device 300 may include an electronic pen 400 that is detachably disposed in a pen holder 3111 formed in at least a portion of the rear cover 311. According to an embodiment of the disclosure, the electronic pen 400 may include an elongated hollow pen housing 401 and a pen tip 402 disposed at one end of the pen housing 401. According to an embodiment of the disclosure, the electronic pen 400 may include a key button 403 disposed in at least a portion of the pen housing 401. According to an embodiment of the disclosure, the electronic pen 400 may be attached to the pen holder 3111 using a magnetic force of at least one magnet. According to an embodiment of the disclosure, the electronic pen 400 may include a battery (not illustrated) disposed in the pen housing 401 and used for short-range wireless communication (e.g., Bluetooth communication). According to an embodiment of the disclosure, the electronic pen 400 may include a coil member (not illustrated) for electromagnetic induction and/or wireless charging, and may charge the battery through the coil member and a wireless charging spot 3111a disposed in the pen holder 3111. According to an embodiment of the disclosure, the detection method of the electronic pen 400 may include an electro-magnetic resonance (EMR) method, an active electrical stylus (AES) method, or an electric coupled resonance (ECR) method.

According to various embodiments of the disclosure, the electronic device 300 may be divided into at least one unit conductive member through non-conductive members 315a and 315b (e.g., polymer) disposed in at least a portion of the rear cover 311 and/or the lateral member 318. The conductive member of the divided unit may be used as an antenna that operates in at least one frequency band.

Figure 5:
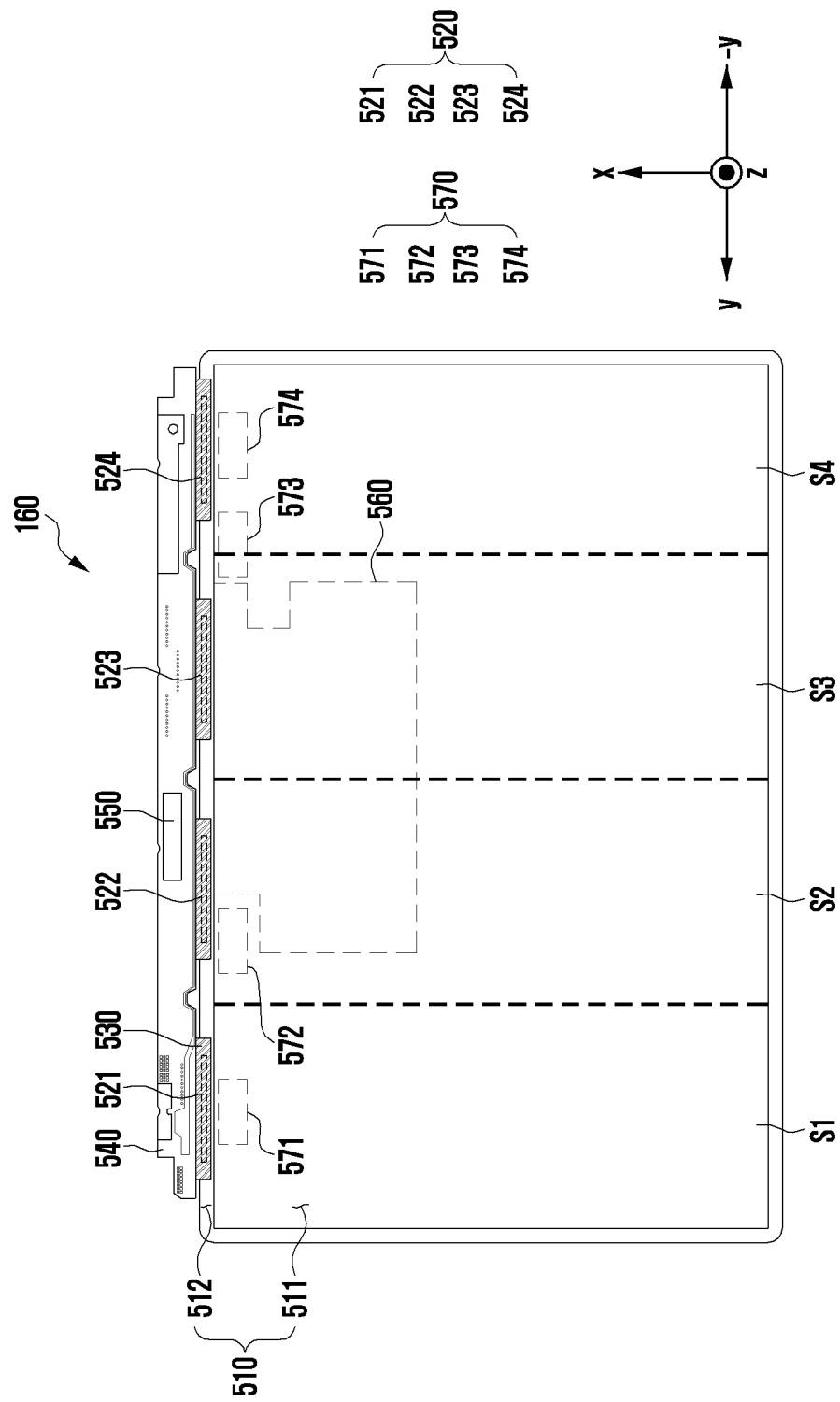
FIG. 5 is a plan view illustrating a front surface of a display module according to an embodiment of the disclosure.
Figure 6:
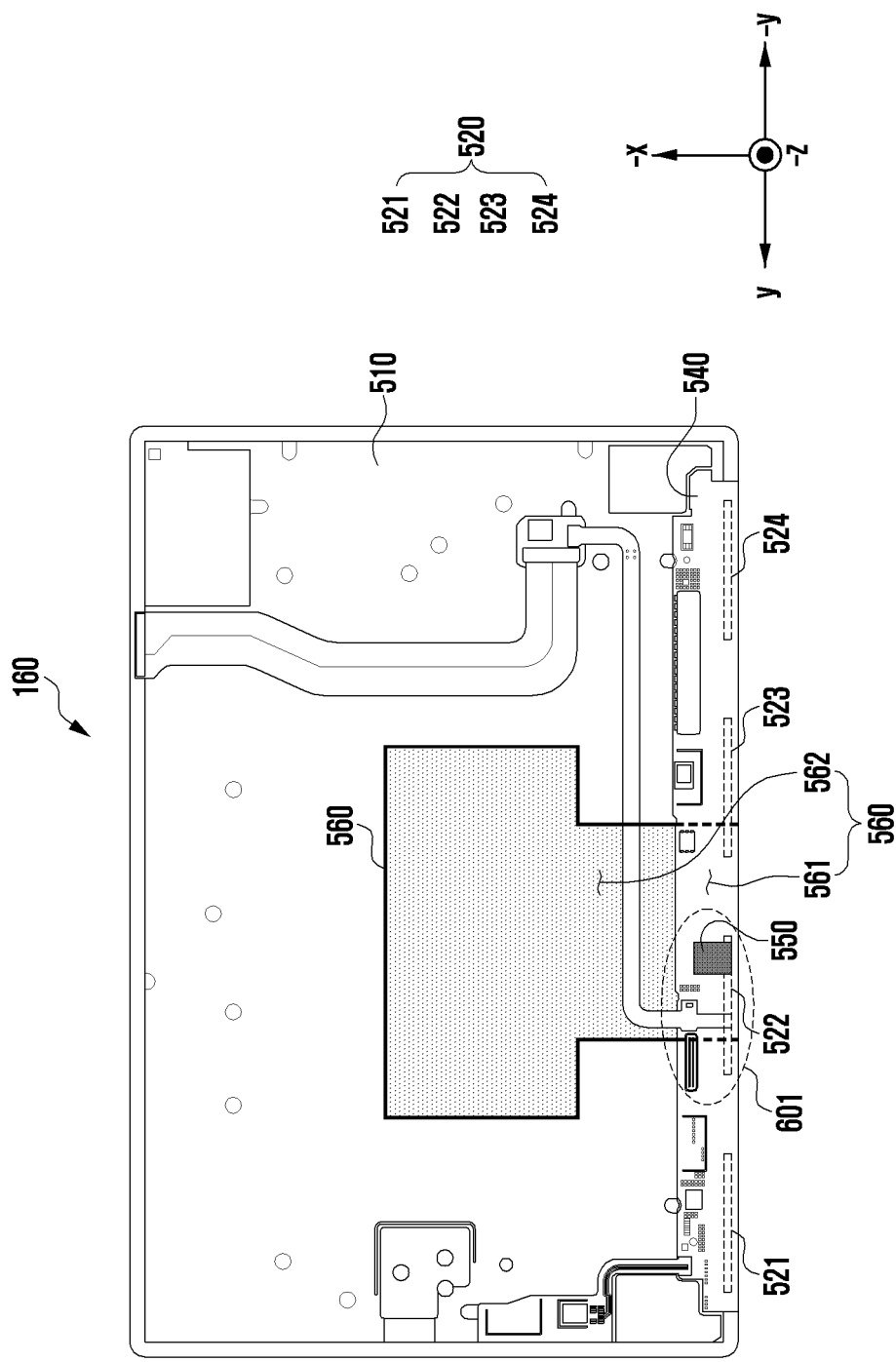
FIG. 6 is a plan view illustrating a rear surface of a display module of FIG. 3 according to an embodiment of the disclosure.

FIG. 5 is a plan view illustrating a front surface of a display module according to an embodiment of the disclosure. FIG. 6 is a plan view illustrating a rear surface of a display module of FIG. 3 according to an embodiment of the disclosure.

Referring to FIG. 5, it illustrates a state in which the flexible circuit board 530 bent toward the rear surface of the display panel 510 is unfolded, and may illustrate a state in which the circuit board 540 disposed on the rear surface of the display panel 510 is placed oriented in the front direction of the display panel 510. FIG. 6 may illustrate a state in which the circuit board 540 is disposed on the rear surface of the display panel 510 by bending the flexible circuit board 530. For example, FIG. 6 may be a plan view illustrating a rear surface of the display module 160 in a state in which the display module 160 is assembled.

The display module 160 illustrated in FIGS. 5 and 6 may include another embodiment at least partially similar to or different from the display module 160 illustrated in FIGS. 1 and 2 and the display panel 301 illustrated in FIGS. 3 and 4. Hereinafter, features of the display module 160 that have not been described or changed in the previous drawings will be mainly described with reference to FIGS. 5 and 6.

Referring to FIGS. 5 and 6, the display module 160 according to various embodiments may include the display panel 510, the plurality of DDICs 520, the flexible circuit board 530 (e.g., flexible PCB(FPCB)), the circuit board 540, and/or the T-CON IC 550.

According to an embodiment of the disclosure, the display panel 510 may include an unbreakable (UB) type OLED display or a YOUM-on cell touch active matrix organic light-emitting diode (AMOLED) (Y-OCTA) type display.

According to an embodiment of the disclosure, the display panel 510 may include a low temperature polycrystalline silicon (LTPS) substrate (not illustrated) or a low temperature polycrystalline oxide (LTPO) substrate (not illustrated). According to an embodiment of the disclosure, an organic light emitting diode (OLED), and/or a plurality of thin film transistors (TFTs) (not illustrated) for driving the OLED, and/or signal wires (e.g., gate lines and/or data lines) may be disposed on the LTPS substrate (or LTPO substrate).

According to an embodiment of the disclosure, the display panel 510 may include a display area 511 (e.g., an active area) that is visually exposed from the outside and/or a non-display area 512 that is not visually exposed from the outside. According to an embodiment of the disclosure, the display area 511 is an area for displaying a user screen, and a plurality of pixels P including OLEDs (e.g., pixels Ps in FIG. 7) may be disposed on the display area 511. This display area 511 may be referred to as a first area or an active area. According to an embodiment of the disclosure, the non-display area 512 is an area that does not display a screen, and the plurality of DDICs 520 for driving signal wires (e.g., gate lines and/or data lines) disposed on the display panel 510 may be disposed on the non-display area 512. For example, the plurality of DDICs 520 may be disposed at intervals in the non-display area 512. This non-display area 512 may be referred to as a second area or a bezel area. According to an embodiment of the disclosure, the plurality of DDICs 520 may be disposed oriented from the display panel 510 in the first direction (z direction), which is the front direction of the electronic device 300.

According to an embodiment of the disclosure, the display area 511 of the display panel 510 may be divided into a plurality of sub-areas S1, S2, S3, and S4 disposed adjacent to each other in a direction perpendicular to a scan direction. Each of the plurality of sub-areas S1, S2, S3, and S4 may be driven by each of the plurality of DDICs 520. For example, the display area 511 of the display is divided into four sub-areas S1, S2, S3, and S4, and each of the four sub-areas S1, S2, S3, and S4 may display some of frame images by each of four DDICs 521, 522, 523, and 524. According to an embodiment of the disclosure, the scan direction may be defined as a direction perpendicular to a direction in which gate lines (not illustrated) of the display panel 510 are disposed. For example, in the case that the gate lines to which scan signals are applied in the display panel 510 are disposed in the y direction (or −y direction), the scan direction may be defined as a (−)x direction (or x direction) perpendicular to the y direction.

According to an embodiment of the disclosure, the display area 511 of the display panel 510 may include a first sub-area S1, a second sub-area S2, a third sub-area S3, and/or a fourth sub-area (S4). According to an embodiment of the disclosure, the four sub-areas S1, S2, S3, and S4 are disposed adjacent to each other in a direction (e.g., the y direction or the ?y direction) perpendicular to the scan direction (e.g., the −x direction or the x direction).

According to an embodiment of the disclosure, the plurality of DDICs 520 may include a first DDIC 521 for driving the first sub-area S1, a second DDIC 522 for driving the second sub-area S2, a third DDIC 523 for driving the third sub-area S3 and/or a fourth DDIC 524 for driving the fourth sub-area S4. According to an embodiment of the disclosure, the four DDICs 521, 522, 523, and 524 are disposed oriented in the first direction (z direction) of the display panel 510 in the non-display area 512, while disposing at intervals in a direction (e.g., y direction or ?y direction) perpendicular to the scan direction (e.g., −x direction or x direction).

According to an embodiment of the disclosure, the plurality of DDICs 520 may be electrically connected to the circuit board 540 disposed on the rear surface (e.g., surface oriented in the second direction (−z direction)) of the display panel 510 through the flexible circuit board 530 disposed to be bent on the side of the display panel 510. According to an embodiment of the disclosure, the plurality of DDICs 520 may be controlled by the T-CON IC 550 or the processor 120 as they are electrically connected to the circuit board 540 through the flexible circuit board 530.

According to an embodiment of the disclosure, each of the plurality of DDICs 520 may receive image data corresponding to each sub-area S1, S2, S3, or S4 from the T-CON IC 550 or the processor 120. According to an embodiment of the disclosure, the plurality of DDICs 520 may receive a synchronization signal (e.g., a horizontal synchronization signal, a vertical synchronization signal, a gate clock signal, a light emission clock signal, and a data enable signal) from the T-CON IC 550. According to an embodiment of the disclosure, each of the plurality of DDICs 520 may drive each of the sub-areas S1, S2, S3, and S4 to display a portion of a frame image corresponding to image data input based on a synchronization signal.

According to an embodiment of the disclosure, the circuit board 540 may be disposed oriented in the second direction (−z direction), which is the rear surface of the electronic device 300, from the display panel 510. According to an embodiment of the disclosure, the circuit board 540 may be electrically connected to the plurality of DDICs 520 through the flexible circuit board 530 disposed to be bent at the side of the display panel 510.

According to an embodiment of the disclosure, the circuit board 540 is a rigid PCB, and electronic parts for driving the display panel 510, for example, the T-CON IC 550 and/or a power supply circuit may be disposed on the circuit board 540. According to an embodiment of the disclosure, the T-CON IC 550 and/or the power supply circuit may be connected to the circuit board 540 and the plurality of DDICs 520 through the flexible circuit board 530, so that the T-CON IC 550 and/or the power supply circuit may be electrically connected to the plurality of DDICs 520. According to an embodiment of the disclosure, the T-CON IC 550 supplies a synchronization signal to the plurality of DDICs 520 under the control of the processor 120 so that a period during which the plurality of DDICs 520 displays frame images corresponding to image data may be controlled. According to an embodiment of the disclosure, the T-CON IC 550 may be disposed oriented in the second direction (−z direction) from the circuit board 540.

According to an embodiment of the disclosure, when the display panel 510 is viewed in the first direction (z direction), the T-CON IC 550 may be disposed to overlap at least some of the plurality of DDICs 520 (e.g., a second DDIC 522) among the plurality of DDICs 520. According to various embodiments of the disclosure, the T-CON IC 550 and/or the plurality of DDICs 520 may be parts that generate higher heat than other parts disposed around the display panel 510 while the display panel 510 displays a screen. In the electronic device 300 according to an embodiment of the disclosure, a portion (e.g., a portion corresponding to 601 in FIG. 6) of the display module 160 in which the T-CON IC 550 and some of the plurality of DDICs 520 (e.g., the second DDIC 522) overlap each other may generate hot spots as the heat generating parts are disposed to overlap each other.

In the electronic device 300 according to various embodiments of the disclosure, the thermal diffusion member 560 is disposed to corresponding to a portion (e.g., a portion corresponding to 601 in FIG. 6) of a display module 160 in which the T-CON IC 550 and some of the plurality of DDICs 520 overlap each other, so that hot spots can be reduced.

According to an embodiment of the disclosure, the thermal diffusion member 560 may be disposed between the circuit board 540 and the display panel 510. According to an embodiment of the disclosure, when the display panel 510 is viewed in the first direction (z direction), the thermal diffusion member 560 may be disposed in an area where at least some (e.g., the second DDIC 522) of the plurality of DDICs 520 and the T-CON IC 550 overlap each other. For example, the T-CON IC 550 may be disposed to overlap the second DDIC 522 among the plurality of DDICs 520, and the thermal diffusion member 560 may be disposed between the display panel 510 and the circuit board 540, and may be disposed in an area where the T-CON IC 550 and the second DDIC 522 overlap.

According to an embodiment of the disclosure, the thermal diffusion member 560 may be disposed to extend from the non-display area 512 where the plurality of DDICs 520 is disposed to the display area 511 when the display panel 510 is viewed in the first direction (z direction). According to an embodiment of the disclosure, the thermal diffusion member 560 may include a first portion 561 disposed on an area where at least some (e.g., the second DDIC 522) of the plurality of DDICs 520 overlaps the T-CON IC 550, and a second portion 562 extending from one end of the first portion 561 and disposed to correspond to the display area 511. According to an embodiment of the disclosure, in the thermal diffusion member 560, the area of the second portion 562 of may be larger than that of the first portion 561. According to another embodiment of the disclosure, the first portion 561 may be a portion of the thermal diffusion member 560 overlapping the circuit board 540, and the second portion 562 may be another portion of the thermal diffusion member 560 that does not overlap the circuit board 540.

According to an embodiment of the disclosure, the circuit board 540 may be attached to the rear surface of the display panel 510 by the double-sided adhesive members 571, 572, 573, and 574, forming a double-sided adhesive 570. For example, the circuit board 540 may be attached to the rear surface oriented in the second direction (−z direction) from the display panel 510 by at least one double-sided adhesive member 571, 572, 573, and 574.

According to an embodiment of the disclosure, the display module 160 may include the plurality of double-sided adhesive members 571, 572, 573, and 574 disposed between the circuit board 540 and the display panel 510. According to an embodiment of the disclosure, the plurality of double-sided adhesive members 571, 572, 573, and 574 may be disposed at intervals in an area where some (e.g., the second DDIC 522) of the plurality of DDICs 520 and the T-CON IC 550 do not overlap each other when the display panel 510 is viewed in the first direction (z direction). For example, the plurality of double-sided adhesive members 571, 572, 573, and 574 may be disposed not to overlap with the thermal diffusion member 560 when the display panel 510 is viewed in the first direction (z direction).

According to another embodiment of the disclosure, at least some of the plurality of double-sided adhesive members 571, 572, 573, and 574 may also be disposed in a portion overlapping the thermal diffusion member 560. According to another embodiment of the disclosure, the plurality of double-sided adhesive members 571, 572, 573, and 574 may include at least one first double-sided adhesive member (not illustrated) disposed not to overlap with the thermal diffusion member 560, and at least one second double-sided adhesive member disposed to overlap the thermal diffusion member 560. In another embodiment of the disclosure, the first double-sided adhesive member may be thicker than the second double-sided adhesive member. For example, the thickness of the first double-sided adhesive member may be substantially equal to the sum of the thickness of the second double-sided adhesive member and the thickness of the thermal diffusion member 560.

According to various embodiments of the disclosure, in order for the display module 160 to reduce the weakening of the adhesive force between the display panel 510 and the circuit board 540 due to the disposition of the thermal diffusion member 560, the area of the thermal diffusion member 560 and the area where the thermal diffusion member 560 is disposed may be adjusted.

According to an embodiment of the disclosure, the flexible circuit board 530 may be a part for electrically connecting the plurality of DDICs 520 and the circuit board 540. According to an embodiment of the disclosure, the flexible circuit board 530 is disposed on one end of the display panel 510 and may be bent due to its flexible characteristic.

Figure 7:
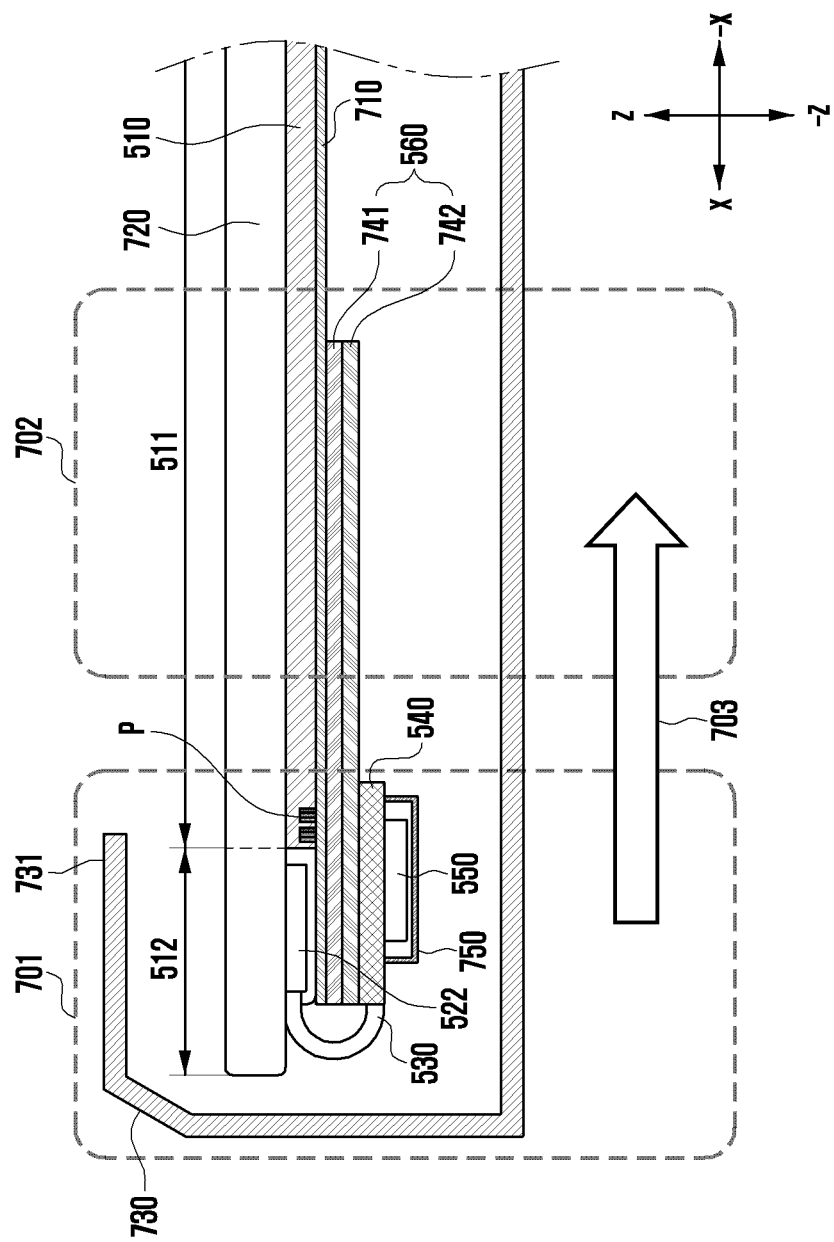
FIG. 7 is a cross-sectional view illustrating a portion of an electronic device in which a DDIC and a T-CON IC are overlapped according to an embodiment of the disclosure.

FIG. 7 is a cross-sectional view illustrating a portion of an electronic device in which DDIC and a T-CON IC are overlapped according to an embodiment of the disclosure.

Referring to FIG. 7, the electronic device 300 may include another embodiment at least partially similar to or different from the electronic devices 101 and 300 illustrated in FIGS. 1 and 3 to 4. The display module 160 illustrated in FIG. 7 may include another embodiment at least partially similar to or different from the display module 160 illustrated in FIGS. 1 and 2, and/or the display panel 301 illustrated in FIGS. 3 and 4, and/or the display module 160 illustrated in FIGS. 5 and 6. Hereinafter, features of the electronic device 300 that have not been described or changed in the previous drawings will be mainly described with reference to FIGS. 5 and 6.

Referring to FIG. 7, the electronic device 300 according to various embodiments may include the display panel 510, a front cover 720 disposed in the first direction (z direction) from the display panel 510, the circuit board 540 disposed in the second direction (−z direction) from the display panel 510, and the thermal diffusion member 560 disposed between the display panel 510 and the circuit board 540.

According to an embodiment of the disclosure, the display panel 510 may be divided into the display area 511 in which a plurality of pixels P is disposed, and the non-display area 512 in which the plurality of DDICs (e.g., the plurality of DDICs 520 in FIG. 5). According to an embodiment of the disclosure, the non-display area 512 may be disposed on at least some edges of the display area 511.

According to an embodiment of the disclosure, the plurality of DDICs 520 for driving the display panel 510 may be disposed in the non-display area 512. For example, the plurality of DDICs 520 may be disposed oriented in the first direction (z direction) from the display panel 510.

According to an embodiment of the disclosure, a front cover 720 (e.g., a front plate or a front window) (e.g., the front cover 302 in FIG. 3) of the electronic device 300 may be disposed in the first direction (z direction) from the display panel 510. According to an embodiment of the disclosure, the front cover 720 may be formed by a glass plate or polymer plate including various coating layers.

According to one embodiment of the disclosure, the front cover 720 may be disposed to overlap the display area 511 and non-display area 512 of the display panel 510 when the display panel 510 is viewed in the first direction (z direction) According to an embodiment of the disclosure, a portion of the front cover 720 disposed to correspond to the non-display area 512 among the front cover 720 may be disposed to overlap a portion 731 of a housing 730 (e.g., the housing 310 in FIG. 3) when the display panel 510 is viewed in the first direction (z direction). For example, the portion 731 of the housing 730 may be disposed oriented in the first direction (z direction) and overlap a portion of the front cover 720 corresponding to the non-display area 512. Accordingly, the non-display area 512 of the display panel 510 may not be visible by the portion 731 of the housing 730 when the display panel 510 is viewed in the first direction (z direction). According to various embodiments of the disclosure, the shape of the housing 730 is not limited to the illustrated example and may be variously changed.

According to an embodiment of the disclosure, an input detection member 710 for detecting an input by a writing member of an electromagnetic induction method may be disposed in the second direction (−z direction) from the display panel 510. According to an embodiment of the disclosure, the input detection member 710 may include a digitizer. According to various embodiments of the disclosure, the input detection member 710 may include a touch detection circuit or a pressure sensor in addition to the digitizer. According to an embodiment of the disclosure, the digitizer may include a member for detecting an input of an electronic pen according to an electro-magnetic resonance (EMR) method, an active electrical stylus (AES) method, or an electric coupled resonance (ECR) method. According to various embodiments of the disclosure, the input detection member 710 may be omitted.

According to an embodiment of the disclosure, the circuit board 540 including the T-CON IC 550 may be disposed in the second direction (−z direction) from the input detection member 710. According to an embodiment of the disclosure, the T-CON IC 550 may be disposed oriented in the second direction (−z direction) from the circuit board 540 and be shielded by a shielding structure 750. According to an embodiment of the disclosure, the shielding structure 750 may be a shield that can be coupled to the circuit board 540 while covering the T-CON IC 550. According to an embodiment of the disclosure, the shielding structure 750 is a configuration for blocking electromagnetic waves generated from the T-CON IC 550 from being emitted and rapidly dissipating the heat generated from the T-CON IC 550 to the outside.

According to an embodiment of the disclosure, the plurality of DDICs 520 disposed oriented to the first direction (z direction) from the display panel 510 and the circuit board 540 disposed oriented in the second direction (−z direction) from the display panel 510 may be electrically connected to each other by the flexible circuit board 530. According to an embodiment of the disclosure, the flexible circuit board 530 may be disposed on one end of the display panel 510 and at least partially bent, thereby connecting the plurality of DDICs 520 and the circuit board 540.

According to an embodiment of the disclosure, when the display panel 510 is viewed in the first direction (z direction), the thermal diffusion member 560 may be disposed on an area where at least some (e.g., the second DDIC 522) of the plurality of DDICs 520 and the T-CON IC 550 overlap each other. According to an embodiment of the disclosure, the thermal diffusion member 560 may be disposed between the circuit board 540 and the input detection member 710 disposed in the second direction (−z direction) from the display panel 510.

According to an embodiment of the disclosure, the stacked structure of the thermal diffusion member 560 may include at least one thermal diffusion layer 741 and/or at least one thermal blocking layer 742. According to an embodiment of the disclosure, the thermal diffusion layer 741 may be disposed to be attached to the rear surface of the display panel 510. For example, the thermal diffusion layer 741 may be disposed to be attached to the input detection member 710 disposed in the second direction (−z direction) from the display panel 510. According to an embodiment of the disclosure, the thermal blocking layer 742 may be disposed in the second direction (−z direction) from the thermal diffusion layer 741. According to an embodiment of the disclosure, the thermal diffusion layer 741 may diffuse the heat generated from the T-CON IC 550 and/or the DDIC 520 to the surroundings. According to an embodiment of the disclosure, the thermal diffusion layer 741 may include graphite. According to various embodiments of the disclosure, the thermal diffusion layer 741 may include a composite member for thermal diffusion in addition to graphite. For example, the thermal diffusion layer 741 may include a thermal interface material (TIM).

According to an embodiment of the disclosure, the thermal blocking layer 742 may block the heat generated from the T-CON IC 550. For example, the thermal blocking layer 742 may block the heat generated from the T-CON IC 550 from being transferred to the DDIC 520. For example, the thermal blocking layer 742 may block the heat generated from the T-CON IC 550 from being transferred to the first direction (z direction) of the display panel 510. According to an embodiment of the disclosure, a portion of the thermal blocking layer 742 disposed to correspond to the display area 511 is disposed to contact air, thereby enhancing heat dissipation. According to an embodiment of the disclosure, the thermal blocking layer 742 may include copper. According to various embodiments of the disclosure, the thermal blocking layer 742 may include a metal member, a metal sheet, or a metal plate in addition to copper.

According to an embodiment of the disclosure, the thermal conductivity of the thermal diffusion layer 741 may be higher than that of the thermal barrier layer 742. For example, the thermal diffusion layer 741 may include graphite and have a thermal conductivity of about 1600 W/K, and the thermal blocking layer 742 may include copper and have a thermal conductivity of about 400 W/K.

According to an embodiment of the disclosure, the thermal blocking layer 742 may have lower thermal conductivity and higher electrical conductivity compared to the thermal diffusion layer 741. For example, the electrical conductivity of the thermal blocking layer 742 may be higher than the electrical conductivity of the thermal diffusion layer 741.

According to an embodiment of the disclosure, in the case that the thermal diffusion member 560 includes a conductive material, a non-conductive coating is applied to the conductive material, and the conductive terminal (e.g., test point) disposed on the surface of the circuit board 540 and the conductive material can be prevented from shorting each other. According to an embodiment of the disclosure, the stacked structure of the thermal diffusion member 560 may further include a non-conductive coating layer (not illustrated) disposed to face the circuit board 540. The stacked structure of the thermal diffusion member 560 further includes a non-conductive coating layer (not illustrated) disposed to face the circuit board 540, such that the conductive terminal (e.g., test point) disposed on the surface of the circuit board 540 and the thermal diffusion member 560 may not be shorted to each other.

According to an embodiment of the disclosure, the thermal diffusion member 560 may electrically connect the ground layer of the circuit board 540 and the rear surface of the display panel 510 to each other through the conductive material portion or the conductive coating in order to remove noise components generated from the display panel 510. According to an embodiment of the disclosure, the stacked structure of the thermal diffusion member 560 may further include a conductive coating layer (not illustrated) disposed to face the circuit board 540. According to an embodiment of the disclosure, the conductive coating layer is electrically connected to the ground of the circuit board 540, thereby connecting the rear surface of the display panel 510 to the ground of the circuit board 540.

According to an embodiment of the disclosure, the thermal diffusion member 560 receives heat from the DDIC 520 and/or the T-CON IC 550 disposed to correspond to the non-display area 512 and may diffuse the transferred heat to the display area 511. For example, as indicated by an arrow 703 in FIG. 7, the heat of the first portion 701 adjacent to an area where heat is intensively generated as the DDIC 520 and the T-CON IC 550 are disposed, i.e., the non-display area 512 may be diffused to the second portion 702 corresponding to a portion of the display area 511 spaced apart from the DDIC 520 and/or the T-CON IC 550 and on which the plurality of pixels Ps is disposed.

A method of an electronic device (e.g., the electronic device 300 in FIG. 3) according to various embodiments may include executing an application based on a user input, determining whether the executed application is a predetermined application, and displaying an execution screen of the application through the display panel 510 while configuring a background screen to a value lower than a predetermined grayscale value if the executed application is the predetermined application.

According to an embodiment of the disclosure, the method may further include detecting a temperature of the display panel 510 through the sensor module of the electronic device 300 and lowering the overall illuminance of the display panel 510 if a temperature of at least a portion of the display panel 510 is greater than a predetermined temperature.

Figure 8:
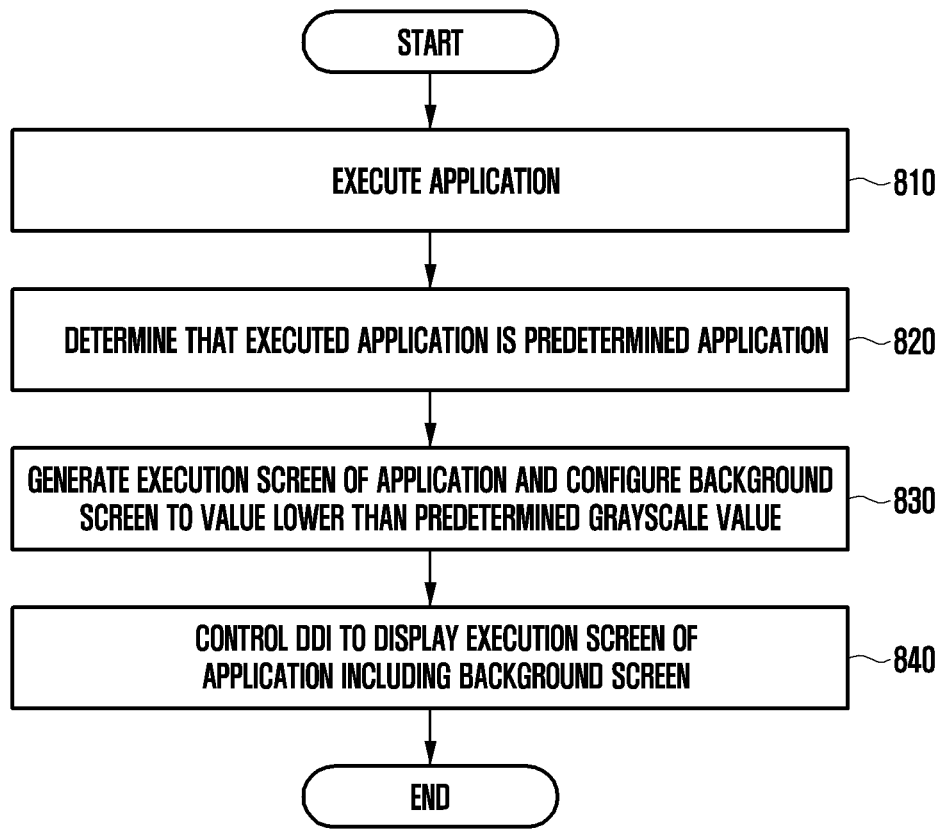
FIG. 8 is a flowchart illustrating an operation of an electronic device when a drawing application is executed according to an embodiment of the disclosure.
Figure 9:
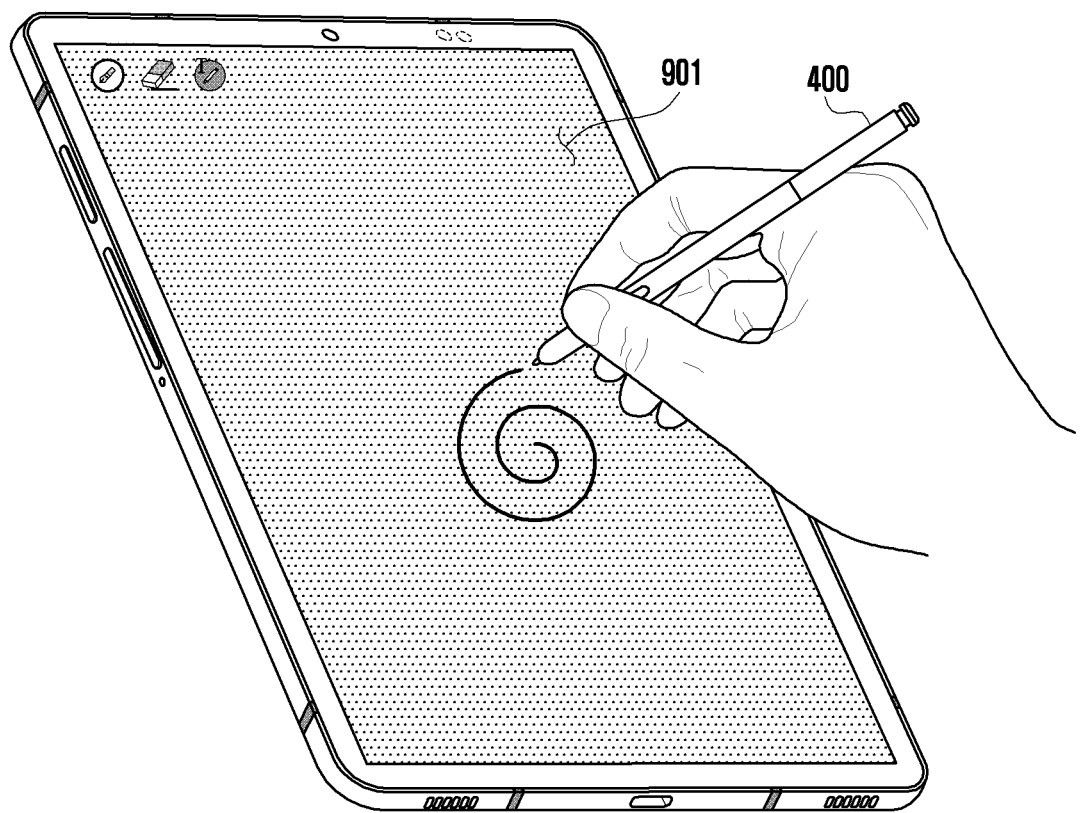
FIG. 9 is a diagram illustrating an operation of an electronic device when a drawing application is executed according to an embodiment of the disclosure.

FIG. 8 is a flowchart illustrating an operation of an electronic device when a drawing application is executed according to an embodiment of the disclosure. FIG. 9 is a diagram illustrating an operation of an electronic device when a drawing application is executed according to an embodiment of the disclosure.

Referring to FIG. 8, at least some of the operations may be omitted. Before or after the at least some operations illustrated in FIG. 8, at least some operations mentioned with reference to other drawings in this document may be additionally inserted.

The operations illustrated in FIG. 8 may be performed by a processor (e.g., the processor 120 in FIG. 1). For example, the memory (e.g., the memory 130 in FIG. 1) of the electronic device 300 may store instructions that cause the processor 120 to perform at least some of the operations illustrated in FIG. 8 when the instructions are executed.

Hereinafter, an operation of the electronic device 300 when a predetermined application (e.g., a drawing application) is executed will be described in conjunction with FIGS. 8 and 9.

In operation 810, the electronic device 300 according to an embodiment may execute an application based on a user input. For example, the user input may include a touch input through the display panel 510, a hovering input, a force touch input, and/or a voice input through a voice assistant application (e.g., Bixby™).

In some embodiments of the disclosure, the electronic device 300 may include an electronic pen (e.g., the electronic pen 400 in FIG. 4), and may execute an application based on a user input through the electronic pen 400. For example, the electronic device 300 detects a user input pressing a key button included in the electronic pen 400 (e.g., the key button 403 in FIG. 4), and may execute an application in response to the user input.

In operation 820, the electronic device 300 according to an embodiment may determine whether the executed application is a predetermined application. For example, in the case that an executed application is included in a preset list, the electronic device 300 may determine that the executed application is a predetermined application. According to an embodiment of the disclosure, the predetermined application may include at least one application configured to detect a user input through the electronic pen 400. For example, the predetermined application may include an image editing application, a video editing application, a drawing application, and/or a note-taking application. According to various embodiments of the disclosure, the predetermined application may be any application that includes a function of detecting a user input through the electronic pen 400 and processing the user input. In another embodiment of the disclosure, the predetermined application may be any application that includes a function of processing a user input based on a touch input or a force touch input, even if the user input through the electronic pen 400 is not detected.

According to various embodiments of the disclosure, the above-mentioned drawing application and/or the note-taking application are only examples of predetermined applications, and may further include other applications according to user configuration.

In operation 830, the electronic device 300 according to an embodiment may generate an execution screen of an application, and configure a background screen of the execution screen to be dark. For example, as illustrated in FIG. 9, the electronic device 300 displays an execution screen 901 of a drawing application (or a note-taking application), and configures the background screen of the execution screen 901 to a value lower than a predetermined grayscale value. According to an embodiment of the disclosure, the electronic device 300 lowers the overall luminance of the display panel 510 by lowering the grayscale of the background screen, thereby reducing heat generation of electronic parts (e.g., the DDIC 520 or the T-CON IC 550).

In operation 840, the electronic device 300 according to an embodiment may control the DDIC 520 to display the execution screen 901 of the application including the dark background screen. For example, a user's hand is likely to touch the surface of the display panel 510 in predetermined applications, such as a drawing application or a note-taking application. When the predetermined applications are executed, the electronic device 300 according to various embodiments may configure the background screen to a value lower than the predetermined grayscale value, thereby reducing heat generation of electronic parts (e.g., the DDIC 520 or the T-CON IC 550), and as a result, it is possible to reduce the heat felt by the user.

Figure 10:
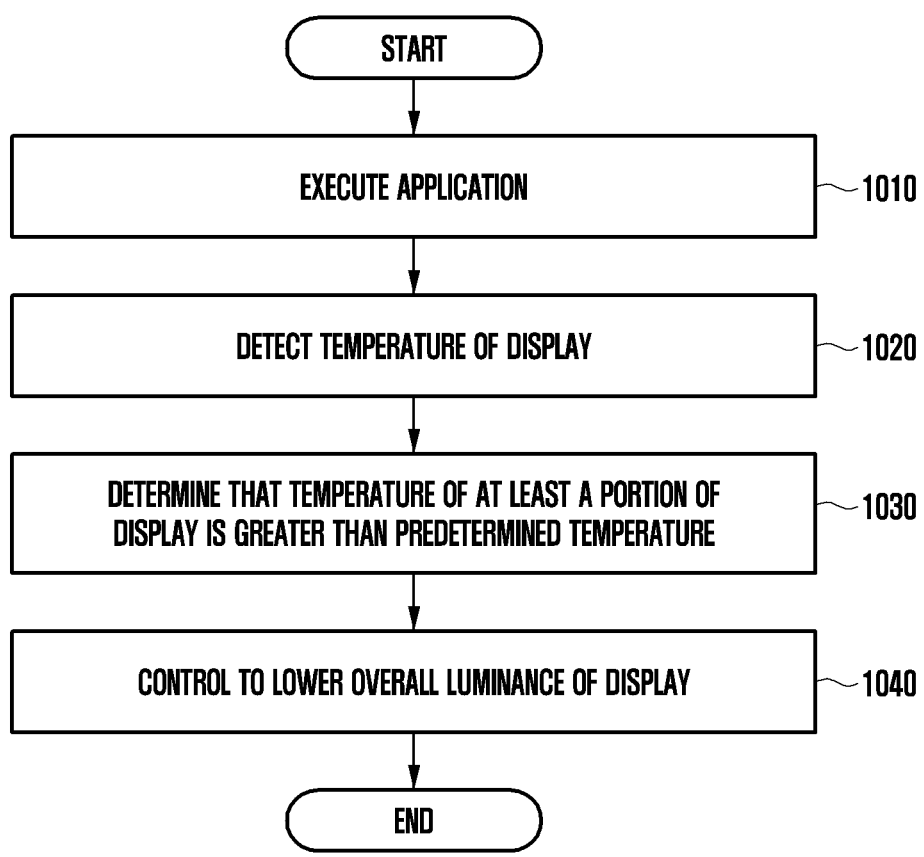
FIG. 10 is a flowchart illustrating an operation of an electronic device for controlling luminance of a display panel based on a temperature of a display panel according to an embodiment of the disclosure.

FIG. 10 is a flowchart illustrating an operation of an electronic device for controlling luminance of a display panel based on a temperature of the display panel according to an embodiment of the disclosure.

Referring to FIG. 10, at least some of the operations may be omitted. Before or after the at least some operations illustrated in FIG. 10, at least some operations mentioned with reference to other drawings in this document may be additionally inserted.

The operations illustrated in FIG. 10 may be performed by a processor (e.g., the processor 120 in FIG. 1). For example, the memory (e.g., the memory 130 in FIG. 1) of the electronic device 300 may store instructions that cause the processor 120 to perform at least some of the operations illustrated in FIG. 10 when the instructions are executed.

In operation 1010, the electronic device 300 according to an embodiment may execute an application based on a user input and control the display panel 510 to display an execution screen of the application. According to an embodiment of the disclosure, the operation 1010 may be at least partially similar to or identical to the operation 810 illustrated in FIG. 8.

In operation 1020, the electronic device 300 according to an embodiment may detect the temperature of the display panel 510 through the sensor module 176 (e.g., a temperature sensor). For example, the electronic device 300 may detect the temperature of each area of the display panel 510 through a temperature sensor (not illustrated). In another embodiment of the disclosure, the electronic device 300 may detect the temperature of at least a portion of an electronic part or housing 310 in addition to the temperature of the display panel 510.

In operation 1030, the electronic device 300 according to an embodiment may determine whether the temperature of at least a portion of the display panel 510 is greater than a predetermined temperature. For example, the electronic device 300 may configure the predetermined temperature to a room temperature between about 35 degrees and about 40 degrees. For example, in the case that the temperature of at least a portion of the display panel 510 is about 42 degrees higher than a room temperature between about 35 degrees and about 40 degrees, the electronic device 300 may determine that at least a portion of the display panel 510 is greater that the predetermined temperature.

In operation 1040, the electronic device 300 according to an embodiment may control the overall luminance of the display panel 510 to be lowered. For example, in the case that the temperature of at least a portion of the display panel 510 is about 42 degrees higher than a room temperature between about 35 degrees and about 40 degrees, by lowering the overall luminance of the display panel 510, the partial heat generation (e.g., the above temperature of about 42 degrees) of the electronic device 300 may be lowered. According to various embodiments of the disclosure, the above-mentioned predetermined temperature of about 35 degrees to about 40 degrees is just one example and may be variously changed.

According to various embodiments of the disclosure, the electronic device 300 detects the temperature of an electronic part or at least a portion of the housing 310 in addition to the temperature of the display panel 510, and may control the luminance of the display panel 510 based on the detected temperature. For example, the processor 120 may detect the temperature of the housing 310 through the sensor module 176, and when the temperature of at least a portion of the housing 310 is greater than a predetermined temperature, the overall luminance of the display panel 510 may be lowered. The processor 120 detects a temperature of at least some of electronic parts disposed in the inner space of the housing 310 (e.g., a central processing device, an application processor 120, a graphic processing device, an image signal processor 120, a sensor hub processor 120, a communication processor 120, a power amp module (PAM), a power management integrated circuit (PMIC), or a charging IC), and may lower the overall luminance of the display panel 510 if the detected temperature is greater than a predetermined temperature.

Figure 11:
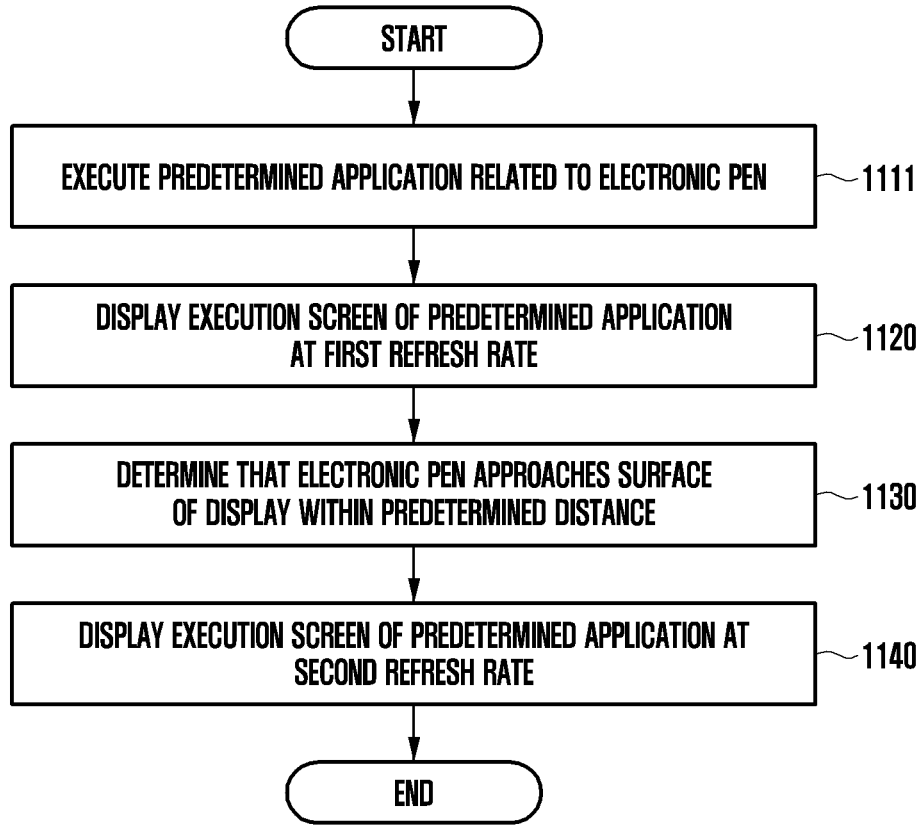
FIG. 11 is a flowchart illustrating an operation of an electronic device for controlling a refresh rate according to a distance between an electronic pen and a surface of a display according to an embodiment of the disclosure.

FIG. 11 is a flowchart illustrating an operation of an electronic device for controlling a refresh rate according to a distance between an electronic pen and a surface of a display according to an embodiment of the disclosure.

Referring to FIG. 11, at least some of the operations may be omitted. Before or after the at least some operations illustrated in FIG. 11, at least some operations mentioned with reference to other drawings in this document may be additionally inserted.

The operations illustrated in FIG. 11 may be performed by a processor (e.g., the processor 120 in FIG. 1). For example, the memory (e.g., the memory 130 in FIG. 1) of the electronic device 300 may store instructions that cause the processor 120 to perform at least some of the operations illustrated in FIG. 11 when the instructions are executed.

In operation 1111, the electronic device 300 according to an embodiment may execute a predetermined application related to the electronic pen 400 based on a user input. For example, the electronic device 300 may execute a drawing application or a note-taking application based on a user input. According to an embodiment of the disclosure, the operation 1111 may be at least partially similar to or identical to the operation 810 illustrated in FIG. 8.

In operation 1120, the electronic device 300 according to an embodiment may display an execution screen of a predetermined application, and control the refresh rate of the display at a first refresh rate. For example, when a drawing application or a note-taking application is executed, the electronic device 300 may configure displaying the execution screen displayed through the display at the first refresh rate as a default. For example, the first refresh rate is a refresh rate for displaying a general screen that does not require a high response speed, and may be, for example, about 60 hertz (Hz).

In operation 1130, the electronic device 300 according to an embodiment may detect whether the electronic pen 400 approaches the surface of the display within a predetermined distance. For example, the electronic device 300 may detect whether a pen tip (e.g., the pen tip 402 in FIG. 4) of the electronic pen 400 approaches the surface of the display within a predetermined distance. According to an embodiment of the disclosure, in the case that the electronic pen 400 approaches the surface of the display within a predetermined distance, the electronic device 300 may predict that the user is expected to perform input on the display through the electronic pen 400.

In operation 1140, the electronic device 300 according to an embodiment may display an execution screen of a predetermined application at a second refresh rate in the case that the electronic pen 400 approaches the surface of the display within a predetermined distance. According to an embodiment of the disclosure, the second refresh rate has a higher value than that of the first refresh rate, and may be, for example, a refresh rate for displaying a moving image requiring a high response speed. For example, the second refresh rate may be about 120 Hz.

In the electronic device 300 according to various embodiments of the disclosure, only in the case that a condition in which a user is expected to perform an input on the display through the electronic pen 400 (e.g., a condition in which the electronic pen 400 approaches the surface of the display within a predetermined distance) is satisfied, power consumption and/or heat generation may be reduced by driving the display at a high refresh rate.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device, comprising:
   a housing;
   a display panel including a display area that is visually exposed from an outside and a non-display area that is not visually exposed from the outside;
   a plurality of display driver integrated circuits (DDICs) disposed at intervals in the non-display area, and disposed oriented in a first direction from the display panel;
   a circuit board disposed in a second direction opposite to the first direction from the display panel, and including a timing controller IC which is disposed to overlap at least some of the plurality of DDICs when the display panel is viewed from the first direction;
   a flexible circuit board disposed at one end of the display panel and electrically connecting the plurality of DDICs and the circuit board; and
   a thermal diffusion member disposed between the circuit board and the display panel, and disposed in an area in which at least some of the plurality of DDICs and the timing controller IC overlap each other when the display panel is viewed from the first direction.

2. The electronic device of claim 1, wherein the thermal diffusion member is disposed to extend from the non-display area to the display area when the display panel is viewed in the first direction.

3. The electronic device of claim 2, wherein the thermal diffusion member includes:
   a first portion disposed to overlap the circuit board, and
   a second portion disposed to extend from one end of the first portion and overlap a portion of the display area, and
   wherein an area of the second portion is larger than an area of the first portion.

4. The electronic device of claim 1, wherein a stacked structure of the thermal diffusion member includes:
   a thermal diffusion layer attached to a rear surface of the display panel oriented in the second direction; and
   a thermal blocking layer disposed in the second direction from the thermal diffusion layer.

5. The electronic device of claim 4, wherein the thermal diffusion layer of the thermal diffusion member includes at least one of graphite and thermal interface material (TIM).

6. The electronic device of claim 4, wherein the thermal blocking layer of the thermal diffusion member includes at least one of copper, a metal member, a metal sheet, and a metal plate.

7. The electronic device of claim 4, wherein the stacked structure of the thermal diffusion member further includes a non-conductive coating layer disposed to face the circuit board.

8. The electronic device of claim 4,
   wherein the stacked structure of the thermal diffusion member further includes a conductive coating layer disposed to face the circuit board, and
   wherein at least a portion of the conductive coating layer is electrically connected to a ground of the circuit board.

9. The electronic device of claim 4, wherein a thermal conductivity of the thermal diffusion layer is higher than a thermal conductivity of the thermal blocking layer.

10. The electronic device of claim 1, further comprising:
    a plurality of double-sided adhesive members disposed between the circuit board and the display panel,
    wherein the plurality of double-sided adhesive members is disposed at intervals in an area where at least some of the plurality of DDICs and the timing controller IC (T-CON IC) do not overlap each other when the display panel is viewed in the first direction.

11. The electronic device of claim 1, further comprising:
    a plurality of double-sided adhesive members disposed between the circuit board and the display panel,
    wherein the plurality of double-sided adhesive members includes:
    at least one first double-sided adhesive member disposed not to overlap the thermal diffusion member, and
    at least one second double-sided adhesive member disposed to overlap the thermal diffusion member, and
    wherein the first double-sided adhesive member is formed to be thicker than the second double-sided adhesive member.

12. The electronic device of claim 1, further comprising:
    a processor configured to:
    control the plurality of DDICs and the timing controller IC,
    execute an application based on a user input,
    determine whether the executed application is a predetermined application that is configured to detect the user input through an electronic pen, and
    display an execution screen of the application while configuring a background screen to a value lower than a predetermined grayscale value if the executed application is the predetermined application.

13. The electronic device of claim 12, wherein the processor is further configured to:
   detect a temperature of the display panel through a sensor module of the electronic device, and
   lower an overall luminance of the display panel if the temperature of at least a portion of the display panel is greater than a predetermined temperature.

14. The electronic device of claim 12, further comprising: an electronic pen,
   wherein the processor is further configured to:
      display the execution screen of the application at a first refresh rate,
      detect whether the electronic pen approaches a surface of the display panel within a predetermined distance,
      display the execution screen of the application at a second refresh rate if the electronic pen approaches the surface of the display panel within a predetermined distance, and
   wherein the second refresh rate is higher than the first refresh rate.

15. The electronic device of claim 14, wherein the second refresh rate has a value corresponding to a multiple of the first refresh rate.

* * * * *